United States Patent [19]

Izu et al.

[11] 4,400,409

[45] Aug. 23, 1983

[54] METHOD OF MAKING P-DOPED SILICON FILMS

[75] Inventors: Masatsugu Izu, Birmingham; Vincent D. Cannella, Detroit; Stanford R. Ovshinsky, Bloomfield Hills, all of Mich.

[73] Assignee: Energy Conversion Devices, Inc., Troy, Mich.

[21] Appl. No.: 151,301

[22] Filed: May 19, 1980

[51] Int. Cl.$^3$ ............................................ H01L 31/18
[52] U.S. Cl. ....................................... 427/39; 29/572; 148/174; 148/1.5; 427/74; 427/85; 427/86; 427/255.5
[58] Field of Search ............. 427/39.85, 74, 86, 255.5; 148/174, 1.5; 29/572

[56] References Cited

U.S. PATENT DOCUMENTS

| | | | |
|---|---|---|---|
| 3,969,163 | 7/1976 | Wakefield | 427/86 |
| 4,013,533 | 3/1977 | Cohen-Solal et al. | 148/174 |
| 4,064,521 | 12/1977 | Carlson | 427/39 |
| 4,152,535 | 5/1979 | Deminet et al. | 29/572 |
| 4,217,374 | 8/1980 | Orshinsky | 427/85 |
| 4,225,222 | 9/1980 | Kempter | 148/174 |
| 4,226,898 | 10/1980 | Orshinsky | 427/85 |

*Primary Examiner*—John D. Smith
*Attorney, Agent, or Firm*—Lawrence G. Norris

[57] ABSTRACT

The production of improved photovoltaic solar cells and the like comprising both p and n type deposited silicon film regions is made possible by a process which provides more efficient p-doped silicon films with higher acceptor concentrations. The process utilizes previously known p-dopant metal or boron gaseous materials in unique forms and conditions in a glow discharge silicon preferably hydrogen and fluorine compensated deposition process. Thus, p-dopant metals like aluminum may be used in an elemental evaporated form, rather than in a gaseous compound form heretofore ineffectively used and deposited with the glow discharge deposited silicon on substrates kept at lower temperatures where fluorine and hydrogen compensation is most effective. Preferably boron in a gaseous compound form like diborane and other p-dopant metals in a gaseous form are used uniquely during the glow discharge deposition of silicon by heating the substrate to heretofore believed undesirably higher temperatures, like at least about 450° C. to 800° C. where at least fluorine compensation, if desired, is still effective. The improved devices, such as solar cells, can be manufactured in a continuous process on a web type substrate moved through a plurality of film deposition chambers. Each of the chambers is dedicated to depositing a particular type of film layer (p, i or n) and is isolated from the other chambers.

43 Claims, 3 Drawing Figures

METHOD OF MAKING P-DOPED SILICON FILMS

BACKGROUND AND SUMMARY OF THE INVENTION

This invention relates to a method of making more efficiently p-doped silicon films with higher acceptor concentrations and devices made therefrom so that improved p-n and p-i-n devices can be now produced in a batch of continuous process involving the successive deposition and formation of all or partially amorphous p and n type silicon films. While the invention has utility in making diodes, switches and amplifier devices like transistors, it has its most important application in the making of photoconductive devices like solar cells or other energy conversion devices.

When crystalline semiconductor technology reached a commercial state, it became the foundation of the present huge semiconductor devices manufacturing industry. This was due to the ability of scientists to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either a p or n conduction type. The fabrication processes for making p-n junction and photoconductive crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material has all resulted in an impossible economic barrier to the large scale use of crystalline semiconductor solar cells for energy conversion. Further, crystalline silicon has an indirect optical edge which results in poor light absorption in the material. Because of the poor light absorption, crystalline solar cells have to be at least 50 microns thick to absorb the incident sunlight. Even if the crystalline material is replaced by polycrystalline silicon with cheaper production processes, the indirect optical edge is still maintained; hence the material thickness is not reduced. The polycrystalline material also involves the addition of grain boundaries and other problem defects. On the other hand, amorphous silicon has a direct optional edge and only one-micron-thick material is necessary to absorb the same amount of sunlight as crystalline silicon.

Accordingly, a considerable effort has been made to develop processes for readily depositing amorphous semiconductor films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films were found to have microvoids and dangling bonds and other defects which produce a high density of localized states in the energy gap thereof. The presence of a high density of localized states in the energy gap of amphorous silicon semiconductor films results in a low degree of photoconductivity and short diffusion lengths, making such films unsuitable for solar cell applications. Additionally, such films cannot be successfully doped or otherwise modified to shift the Fermi level close to the conduction or valence bands, making them unsuitable for making Schottky barrier or p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in *Solid State Communications,* Vol. 17, pp. 1193–1196, 1975, toward the end of reducing the localized states in the energy gap in the amorphous silicon or germanium to make the same approximate more closely intrinsic crystalline silicon or germanium and of substitutionally doping said amorphous materials with suitable classic dopants, as in doping crystalline materials, to make them extrinsic and of p or n conduction types. The reduction of the localized states was accomplished by glow discharge deposition of amorphous silicon films wherein a gas of silane ($SiH_4$) was passed through a reaction tube where the gas was decomposed by an r.f. glow discharge and deposited on a substrate at a substrate temperature of about 500°–600° K. (227° C.–327° C.). The material so deposited on the substrate was an intrinsic amorphous material consisting of silicon and hydrogen. To produce a doped amorphous material a gas of phosphine ($PH_3$) for n-type condition or a gas of diborane ($B_2H_6$) for p-type conduction were premixed with the silane gas and passed through the glow discharge reaction tube under the same operating conditions. The gaseous concentration of the dopants used was between about $5\times10^{-6}$ and $10^{-2}$ parts per volume. The material so deposited included supposedly substitutional phosphorus or boron dopant and was shown to be extrinsic and of n or p conduction type. However, the doping efficiency for the same amount of added dopant material was much poorer than that of crystalline silicon. The electrical conductivity for highly doped n or p material was low, being about $10^{-2}$ or $10^{-3}$ $(\Omega cm)^{-1}$. In addition, the band gap was narrowed due to the addition of the dopant materials especially in the case of p-doping using diborane. These results indicate that diborane did not efficiently dope the amorphous silicon but created localized states in the band gap.

As expressed above, amorphous silicon, and also germanium, is normally four-fold coordinated, and normally has microvoids and dangling bonds or other defective configurations, producing localized states in the energy gap. While it was not known by these researchers, it is now known by the work of others that the hydrogen in the silane combines at an optimum temperature with many of the dangling bonds of the silicon during the glow discharge deposition, to decrease substantially the density of the localized states in the energy gap toward the end of making the amorphous material approximate more nearly the corresponding crystalline material.

However, the incorporation of hydrogen not only has limitations based upon the fixed ratio of hydrogen to silicon in silane, but, most importantly, various Si:H bonding configurations introduce new antibonding states which can have deleterious consequences in these materials. Therefore, there are basic limitations in reducing the density of localized states in these materials which are particularly harmful in terms of effective p as well as n doping. The resulting unacceptable density of states of the silane-deposited materials leads to a narrow depletion width, which in turn limits the efficiencies of solar cells and other devices whose operation depends on the drift of free carriers. The method of making these materials by the use of only silicon and hydrogen also results in a high density of surface states which affects all the above parameters.

After the development of the glow discharge deposition of silicon from silane gas was carried out, work was done on the sputter depositing of amorphous silicon films in the atmosphere of a mixture of argon (required by the sputtering deposition process) and molecular hydrogen, to determine the results of such molecular hydrogen, to determine the results of such molecular hydrogen on the characteristics of the deposited amorphous silicon film. This research indicated that the hydrogen acted as an altering agent which bonded in such a way as to reduce the localized states in the energy gap. However, the degree to which the localized states of the energy gap were reduced in the sputter deposition process was much less than that achieved by the silane deposition process described above. The above described p and n dopant gases also were introduced in the sputtering process to produce p and n doped materials. These materials had a lower doping efficiency than the materials produced in the glow discharge process. Neither process produced efficient p-doped materials with sufficiently high acceptor concentrations for producing commercial p-n or p-i-n junction devices. The n-doping efficiency was below desirable acceptable commercial levels and the p-doping was particularly undesirable since it reduced the width of the band gap and increased the numbers of localized states in the band gap.

The prior deposition of amorphous silicon, which has been altered by hydrogen from the silane gas in an attempt to make it more closely resemble crystalline silicon and which has been doped in a manner like that of doping crystalline silicon, has characteristics which in all important respects are inferior to those of doped crystalline silicon. Thus, inadequate doping efficiencies and conductivity were achieved especially in the p-type material, and the photoconductive and photovoltaic qualities of these silicon films left much to be desired.

A substantive breakthrough in forming amorphous silicon films with a very low density of states was achieved by the inventions disclosed in copending U.S. application Ser. Nos. 884,664 and 887,353 which produced amorphous films, particularly silicon amorphous films, having the relative favorable attributes of crystalline semiconductor materials. (The former application discloses the deposition of improved amorphous silicon films using vapor deposition thereof and the latter application discloses the deposition of improved amorphous silicon films by glow discharge of silicon-containing gases.) The improved amorphous intrinsic silicon films produced by the processes disclosed therein have reduced number of states in the band gap in the intrinsic material and provide for greatly increased n-doping efficiencies, high photoconductivity and increased mobility, long diffusion length of the carriers, and low dark intrinsic electrical conductivity as desired in photovoltaic cells. Thus, such amorphous semiconductor films can be useful in making more efficient devices, such as solar cells and current controlling devices including p-n junction devices, diodes, transistors and the like.

The invention which achieved these results incorporates into the amorphous films, preferably as they are being deposited, alterant or compensating materials which are believed to form alloys with the amorphous semiconductor materials and modify the same so as to greatly reduce the localized states in the energy gap thereof to make the same equivalent in many respects to intrinsic crystalline silicon. In the process of forming silicon films disclosed in said application Ser. No. 887,353 a compound including silicon as an element thereof is decomposed by glow discharge decomposition to deposit amorphous silicon on a substrate along with the incorporation of a plurality of alterant elements, preferably activated fluorine and hydrogen, during the glow discharge deposition.

In these specific embodiments of the invention disclosed in the latter application, silicon is deposited in a batch mode at a substrate temperature of about 380° C. by the glow discharge of silicon tetrafluoride ($SiF_4$) which supplies the silicon in the deposited amorphous films and fluorine as one alterant or compensating element. While silicon tetrafluoride can form a plasma in a glow discharge, it is not by itself most effective as a starting material for glow discharge deposition of silicon. The atmosphere for the glow discharge is made reactive by adding a gas like molecular hydrogen ($H_2$), which is made reactive by the glow discharge by changing it to atomic hydrogen or hydrogen ions or the like. This reactive hydrogen reacts in the glow discharge with the silicon tetrafluoride so as to more readily cause decomposition thereof and to deposit amorphous silicon therefrom on the substrate. At the same time, fluorine and various silicon subfluorides are released and made reactive by the glow discharge. The reactive hydrogen and the reactive fluorine species are incorporated in the amorphous silicon host matrix as it is being deposited and create a new intrinsic material which has a low number of defect states. A simple way to consider the new alloy is that there is a satiation of capping of dangling bonds and the elimination of other defects. Hence, these alterant elements reduce substantially the density of the localized states in the energy gap, with the foregoing beneficial results accruing.

When it is desired to provide n-type and p-type conduction in the amorphous silicon semiconductor matrix, the latter application recommends incorporation of modifier elements in gaseous form during the glow deposition of the film. The recommended modifier elements or dopants for n-type conduction are phosphorous and arsenic in the form of the gases phosphine ($PH_3$) and arsine ($AsH_3$). The recommended modifier elements or dopants for p-type conduction are boron, aluminum, gallium and indium, in the form of the gases diborane ($B_2H_6$), $Al(C_2H_5)_3$, $Ga(CH_3)_3$ and $In(CH_3)_3$. The modifier elements were added under the same deposition conditions as described for the intrinsic material with a substrate temperature of about 380° C.

While the process for making deposited silicon devices in the aforesaid applications represents a significant improvement, making possible the production of improved solar cells and other devices, the p-doped deposited silicon material did not have a p-type conductivity as efficient as desired. As reported in the *Journal of Non-Crystalline Solids*, Volumes 35 and 36, Part I, January/February, 1980, pp 171–181, with the addition of 500 ppm $PH_3$ in the deposition gases, corresponding to an $n^+$ layer, no band gap change is evident between the $n^+$ layer and the intrinsic material. With the addition of diborane ($B_2H_6$) in the deposition gases, significant changes in optical absorption takes place. The implication is that a new alloy involving boron has been synthesized which possesses a more narrow band gap and exhibits p-type characteristics. It is possible that three-center bonds unique to boron are responsible in part for this behavior. This is in contrast to the results obtained when phosphorus or arsenic are added where a conventional n-type material is produced.

While devices like a Schottky barrier or MIS device can be made with or without p-doped films, they are difficult to manufacture since the properties of the thin barrier layer commonly used therein is difficult to control and frequently the thin layer cannot be efficiently encapsulated to prevent diffusion of environmental elements therethrough with the result that the device is frequently unstable. In addition, such structures lead to a high sheet resistance in the upper level of the device. It appears that a photovoltaic cell having desired efficiency and stability requires utilizing a p-n or p-i-n junction. For this purpose, an improved p-doped material is desirable to increase the efficiency of the cell.

In making the fluorine and hydrogen compensated glow discharge deposited silicon films disclosed in the latter aforesaid application, the silicon is preferably deposited at a substrate temperature of about 380° C. Above this substrate temperature, the efficiency of the hydrogen compensation gradually decreases and at temperatures above about 450° C. reduces significantly, because the hydrogen does not readily combine with the depositing silicon at such temperatures.

As noted above, it has been discovered that the introduction of the gaseous p-dopant materials, while producing a p-type material, do not produce a material with a p-type conduction efficiency as would be theorized if only the desired four-sided or tetrahedral bonding were taking place. It appears that at the glow discharge substrate temperatures of 400° C. or below, which are necessary for the most efficient hydrogen compensation of the silicon material, some of the would-be p-dopant materials are three-fold rather than tetrahedrally coordinated, because of the absence of crystalline constraints, thus leading to additional states in the gap and no doping. Other processes involving diborane lead to the formation of three-centered bonds, or other less efficient combinations because the metallic or boron parts thereof do not readily disassociate completely from their hydrocarbon or hydrogen companion constituents and so do not in such form provide an efficient p-doping element in the silicon host matrix. Furthermore, states are added in the band gap of such materials which are believed to reduce the p-doping efficiency achieved.

Therefore, appreciable effort has been made to improve the p-doping efficiency of said p-doping elements in glow discharge deposited silicon material. Glow discharge deposition of silicon for photovoltaic and other applications requiring intrinsic layers or p-n junction formed depletion regions presently appears to be the preferred deposition method therefor, since the degree of hydrogen and fluorine compensation and reduced density of states in the resulting material are superior to that obtained by vapor deposition or sputtering of silicon.

The present invention has to do with a method of more efficiently p-doping material in a glow discharge silicon deposition batch or continuous process to produce more efficiently doped p-type materials and p-n and p-i-n junction devices incorporating the more efficiently p-doped silicon materials. The methods of making p-doped material in the prior art have been limited to use of conventional dopant gases, such as diborane, under the deposition conditions optimized for the intrinsic materials. No one heretofore considered p-dopant gaseous boride compounds (such as $B_2H_6$) and p-dopant metal gaseous compounds useful in glow discharge deposition of amorphous (or polycrystalline) silicon deposited at substrate temperatures above about 450° C. which has been considered to be outside the temperature range required for the preparation of the useful amorphous silicon.

The present invention also encompasses the method of making a more efficiently p-doped glow discharge deposited silicon by depositing the material above about 450° C. The loss of the advantages of hydrogen compensation in the silicon materials deposited at these high temperatures is more than overcome by the increased efficiency of the p-doping achieved, especially where the p-doped deposited layer is to form an ohmic $p^+$ interface with the associated electrode. As previously stated, it appears that at these high temperatures the boron or metal p-dopant elements are so substantially disassociated from the hydrogen and hydrocarbon elements of the gaseous compound used that the three center or other undesirable bonding configurations are eliminated. The desired four-sided (tetrahedral) bonding which is efficient for p-doping is thus obtained. Although p-doping metal (i.e. Al, Ga, In, Zn and Tl) compound gases were also not effective as p-type dopants in the glow discharge deposition of silicon using substrate temperatures at or below about 400° C., these elements are good p-dopants in gaseous compound form using the much higher silicon glow discharge substrate temperatures described herein (that is temperatures at least about 450° C.). It should be noted that although the high substrate temperatures above about 450° C. can result in inefficient hydrogen compensation of the silicon material, the material is still effectively fluorine compensated since fluorine efficiently combines with the deposited silicon at substrate temperatures up to the range of 700° C. to 800° C.

For amorphous silicon deposited without hydrogen or fluorine compensation, the crystallization process becomes important at substrate temperatures of about 550° C. For depositing amorphous silicon with hydrogen compensation and/or alloying the amorphous state substantially is maintained up to substrate temperatures of about 650° C. For amorphous silicon compensated with hydrogen and doped with boron, the amorphous state remains to substrate temperatures about 700° C. The addition of fluorine such as in the materials of this invention, extend the amorphous state of the deposited material to still higher substrate temperatures. From this it is clear that the present process produces fluorine compensated amorphous silicon doped with boron at substrate temperatures above 700° C. Doping levels achieved with deposition substrate temperatures such that the hydrogen and fluorine compensated silicon film remains substantially amorphous, will be sufficient for certain doping applications. For still higher doping levels, higher deposition substrate temperatures may be used such that the amorphous material will become mixed with crystallites of silicon, or become substantially polycrystalline.

The inclusion of crystallite material into the amorphous deposited silicon or the use of substantially polycrystalline p-doped material does not impair the efficiency of a p-n or $p^+$-i-$n^+$ photovoltaic device. The efficiency is not impaired because the efficiency of p doping in polycrystalline silicon is well known, and because the optical absorption of the crystallites will be lower than that of the amorphous material, so the photon absorption in the photoactive layer will not be affected. For amorphous materials with high absorption coefficients, the $p^+$ layer in a $p^+$-i-$n^+$ structure is kept as thin as possible, less than 1000 angstroms, to minimize absorption of photons since it is a non-photoactive layer. The layer thickness still provides enough positive carriers to bend the conduction and valence bands between the $p^+$ and the intrinsic layer in the device for efficient photovoltaic action. The admixture of silicon crystallites into the amorphous silicon, not only does not impair the efficiency of a $p^+$-i-$n^+$ device, but also may assist the efficiency of a p-n photovoltaic device because of the increased hole mobility and increased photoconductivity of the crystalline p material compared with amorphous p material.

The present invention also discloses the method of eliminating the difficulty of p-doping by utilizing an unconventional non-gaseous material as a dopant. The method includes heating a solid metal to a high temperature to evaporate the metal and then feed the metal vapor directly into the glow discharge chamber with the silicon deposition gases continuously or intermittently. The p-dopant metals in a vaporized metallic form are effective in the glow discharge deposition of silicon at lower substrate temperatures, where fluorine and hydrogen compensation is desired. These evaporated p-dopant metals can also be utilized with glow discharge silicon deposited film at higher substrate temperatures where hydrogen compensation is not needed.

Utilizing the present invention, p-dopant boron and metal materials may be deposited in a continuous process combined with n and intrinsic type glow discharge deposited amorphous materials to manufacture improved p-n and p-i-n junction photovoltaic and the like devices. In the continuous process, the materials are glow discharge deposited upon a web substrate as it is continuously or stepwise moved through separate deposition stations each having the substrate temperature and other environmental conditions necessary to efficiently deposit the particular desired p and n and/or intrinsic type silicon films on the continuous web. In the continuous manufacturing process of the invention, each deposition station is dedicated to depositing one layer (p, i, or n), because the deposition materials contaminate the station background environment and are not easily removed.

While the principles of this invention apply to the aforementioned amorphous and polycrystalline type silicon semiconductor materials, for purposes of illustration herein and as setting forth preferred embodiments of this invention, specific reference is made to gaseous boron and gaseous and evaporated metal p-dopant material glow discharge deposited with the silicon material at substrate temperatures of between 450° C. to 700° C.

The deposited film will be fluoride compensated throughout the substrate temperature range, but the hydrogen compensation will decrease with increasing substrate temperature. Also, the evaporated metal p-dopant materials may be glow discharge deposited with the silicon material at substrate temperatures below 400° C. to form a hydrogen and flouride compensated p-doped material.

In summary, to bring the significance of the present invention into focus, it is believed that the present invention enables the fabrication of more efficient p-type amorphous semiconductor films for use in the manufacture of solar cells and current devices including p-n and p-i-n devices. Additionally, the present invention provides for viable mass production of the various devices in a glow discharge environment with boron or at least one of the metals Al, Ga, In, Zn or Tl providing the p-dopant material at prescribed substrate temperatures.

The above-described and other advantages and features of the present invention will become more apparent upon making reference to the following additional disclosures, the drawings and the claims.

DESCRIPTION OF EXEMPLARY FORMS OF THE INVENTION

Figure 1:
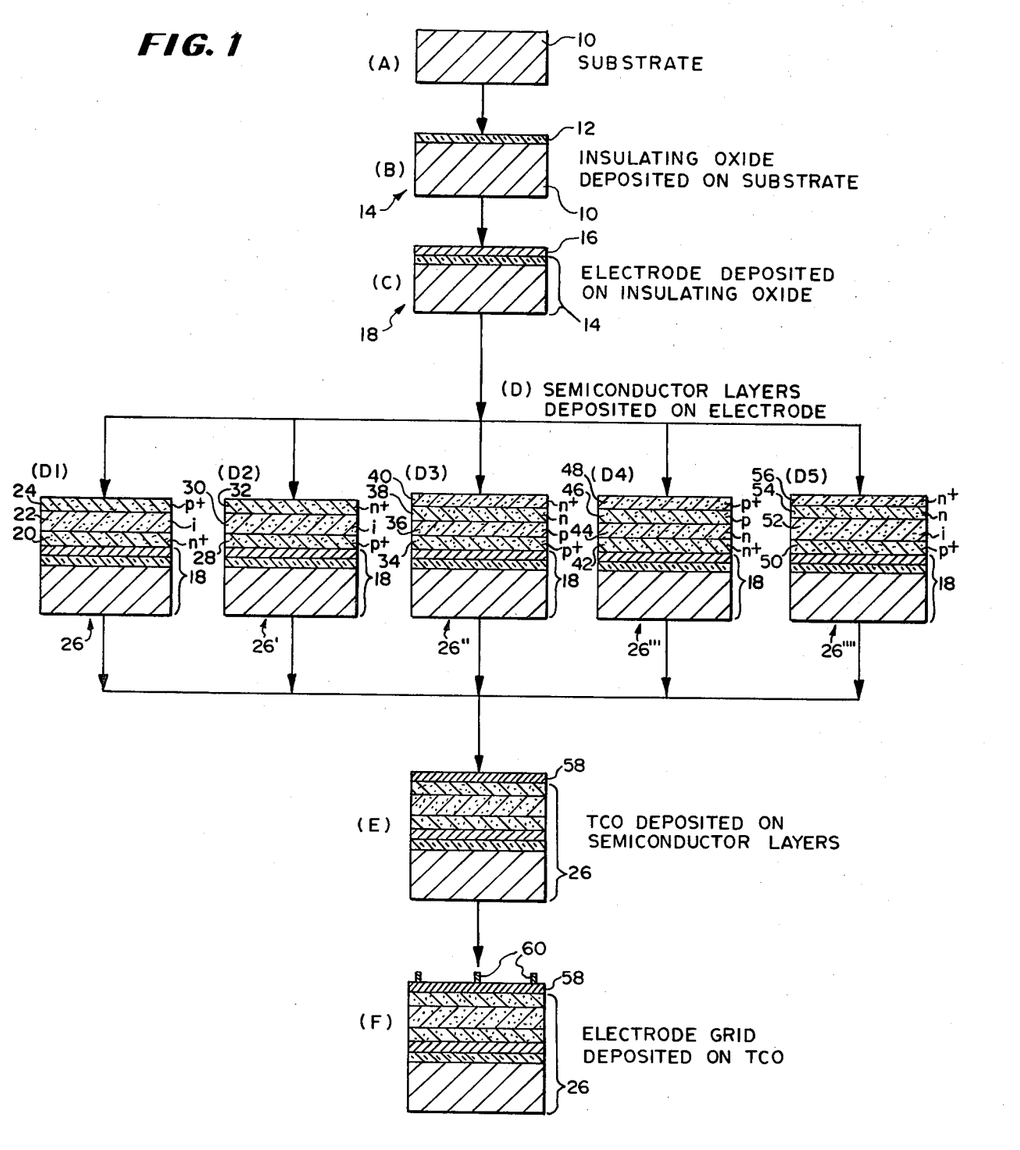
FIG. 1 is a partial schematic and partial diagrammatic illustration of the process steps for making semiconductor devices including the p-doped material of the invention.

Referring to FIG. 1, the first step (A) in the manufacture of the devices incorporating the improved p-type material of the invention includes forming a substrate 10. The substrate may be formed of a non-flexible material such as glass where a batch process is involved or of a flexible web such as aluminum or stainless steel, especially where a continuous mass production process is involved. Thus, the flexible substrate web 10 may be utilized in a continuous process to deposit the various layers of metal electrode-forming and silicon layers as the web is drawn through various deposition stations to be described hereinafter with respect to FIGS. 2 and 3. The aluminum or stainless steel substrate 10 preferably has a thickness of at least about 3 mils, and preferably about 15 mils and is of a width as desired. In the case where the web 10 is a thin, flexible web it is desirably purchased in rolls.

The second step (B) includes depositing an insulating layer 12 on top of the aluminum or stainless steel substrate 10 so that spaced insulated electrode-forming layers are formed, if desired, thereon. The layer 12, for instance, about 5 microns thick can be made of a metal oxide. For an aluminum substrate, it preferably is aluminum oxide ($Al_2O_3$) and for a stainless steel substrate it may be silicon dioxide ($SiO_2$) or other suitable glass. The substrate can be purchased with the insulating layer 12 preformed thereon or the insulating layer 12 can be laid upon the top of the substrate surface 10 in a conventional manufacturing process such as by chemical deposition, vapor deposition or anodizing in the case of the aluminum substrate. The two layers, substrate 10 and oxide layer 12, form an insulated substrate 14.

The third step (C) includes depositing one or more electrode-forming layers 16 on the insulated substrate 4 to form a base electrode substrate 18 for the junction device to be formed thereon. The metal electrode layer or layers 16 preferably is deposited by vapor deposition, which is a relatively fast deposition process. The electrode layers preferably are reflective metal electrodes of molybdenum, aluminum, chrome or stainless steel for a photovoltaic device. The reflective electrode is preferable since, in a solar cell, non-absorbed light which passes through the semiconductor material is reflected from the electrode layers 16 where it again passes through the semiconductor material which then absorbs more of the light energy to increase the device efficiency.

The base electrode substrate 18 is then placed in a glow discharge deposition environment, such as the chamber described in said application Ser. No. 887,353, or a continuous process apparatus as discussed hereinafter with respect to FIGS. 2 and 3. The specific examples shown in D1-D5 are merely illustrative of the various p-i-n or p-n junction devices which can be manufactured utilizing the improved p-doping methods and materials of the invention. Each of the devices is formed using the base electrode substrate 18. Each of the devices illustrated in D1-D5 have silicon films having an overall thickness of between about 5000 and 30,000 angstroms. This thickness ensures that there are no pin holes or other physical defects in the structure and that there is maximum light absorption efficiency. A thicker material may absorb more light, but at some thickness will not generate more current since the greater thickness allows more recombination of the light generated electron-hole pairs. (It should be understood that the thicknesses of the various layers shown in D1-D5 are not drawn to scale.)

Referring first to D1, an n-i-p device is formed by first depositing a heavily doped n+ silicon layer 20 on the substrate 18. Once the n+ layer 20 is deposited an intrinsic (i) silicon layer 22 is deposited thereon. The intrinsic layer 22 is followed by a highly doped conductive p+ silicon layer 24 deposited as the final semiconductor layer. The silicon layers 20, 22 and 24 form the active layers of an n-i-p device 26.

While each of the devices illustrated in D1-D5 may have other utilities, they will be now described as photovoltaic devices. Utilized as a photovoltaic device, the selected outer, p+ layer 24 is a low light absorption, high conductivity layer. The intrinsic layer 22 is a high absorption, low conductivity and high photoconductive layer over a low light absorption, high conductivity n+ layer 20. The overall device thickness between the inner surface of the electrode layer 16 and the top surface of the p+ layer 24 is, as stated previously, on the order of at least about 5000 angstroms. The thickness of the n+ doped layer 20 is preferably in the range of about 50 to 500 angstroms. The thickness of the amorphous intrinsic layer 22 is preferably between about 5000 angstroms to 30,000 angstroms. The thickness of the top p+ contact layer 24 also is preferably between 50 to 500 angstroms. Due to the shorter diffusion length of the holes, the p+ layer generally will be as thin as possible on the order of 50 to 150 angstroms. Further, the outer layer (here p+ layer 24) whether n+ or p+ will be kept as thin as possible to avoid absorption of light in that contact layer.

Each of the layers can be deposited upon the base electrode substrate 18 by a conventional glow discharge chamber described in the aforesaid U.S. application Ser. No. 887,353 or preferably in a continuous process described hereinafter with respect to FIGS. 2 and 3. In either case, the glow discharge system initially is evacuated to approximately 20 mTorr to purge or eliminate impurities in the atmosphere from the deposition system. The silicon material preferably is then fed into the deposition chamber in a compound gaseous form, most advantageously as silicon tetrafluoride ($SiF_4$). The glow discharge plasma preferably is obtained from a silicon tetrafluoride and hydrogen ($H_2$) gas mixture, with a preferred ratio range of from about 4:1 to 10:1. Preferably, the deposition system is operated at a pressure in the range of about 0.3 to 1.5 Torr, preferably between 0.6 to 1.0 Torr such as about 0.6 Torr.

The semiconductor material is deposited from a self-sustained plasma onto the substrate which is heated, preferably by infrared means to the desired deposition temperature for each layer. The p-doped layers of the devices are deposited at specific temperatures, depending upon the form of the p-doping material used. The evaporated p-dopant metal vapors can be deposited at the lower temperatures, at or below about 400° C., where a well compensated silicon material is desired, but it can be deposited at higher temperatures up to about 1000° C. The upper limitation on the substrate temperature in part is due to the type of metal substrate 10 utilized. For aluminum the upper temperature should not be above about 600° C. and for stainless steel it could be above about 1000° C. If a well compensated amorphous silicon layer is to be produced, which is necessary to form the intrinsic layer in a n-i-p or p-i-n device, the substrate temperature should be less than about 400° C. and preferably about 300° C.

To deposit an amorphous p-doped hydrogen compensated silicon material utilizing the evaporated metal vapors of the invention, the substrate temperature is in the range of about 200° C. to 400° C., preferably in the range of about 250° C. to 350° C., and desirably about 300° C.

To deposit the silicon semiconductor material utilizing the p-dopant gases of the invention, the substrate temperature is in the range of about 450° C. to 800° C., preferably in the range of about 500° C. to 700° C.

The doping concentrations are varied to produce the desired p, p+, n or $n^{30}$ type conductivity as the layers are deposited for each device. For n or p doped layers, the material is doped with 5 to 100 ppm of dopant material as it is deposited. For n+ or p+ doped layers the material is doped with 100 ppm to over 1 percent of dopant material as it is deposited. The n dopant material can be phosphine or arsine in the above amounts. The p dopant material can be those of the invention deposited at the respective substrate temperatures preferably in the range of 100 ppm to over 5000 ppm for the p+ material.

The glow discharge deposition process includes an a.c. signal generated plasma into which the materials are introduced. The plasma preferably is sustained between a cathode and substrate anode with an a.c. signal of about 1 kHz to 13.6 MHz.

Although the p-doping method and materials of the invention can be utilized in devices with various silicon amorphous semiconductor material layers it is preferable that they are utilized with the fluorine and hydrogen compensated glow discharge deposited materials disclosed in said U.S. application Ser. No. 887,353. In this case, a mixture of silicon tetrafluoride and hydrogen is deposited as an amorphous silicon compensated material at or below about 400° C., for the intrinsic and n-type layers. In the examples shown in D2, D3 and D5, the p+ layer which is placed upon the electrode layer 16 can be deposited at a higher substrate temperature above about 450° C. which will provide a material which is fluorine compensated. The material will then not be efficiently hydrogen compensated since the hydrogen does not efficiently deposit with the silicon at the higher substrate temperature ranges, and will be swept away with the exhaust gases.

The devices illustrated in D1 and D4 where the p+ layers are on the outer side of the intrinsic "i" layer may not have high temperature deposited p+ layers, since substrate deposition temperatures above about 450° C. would destroy the hydrogen compensation underlying character of the layers, the intrinsic "i" layer being one which may be a well hydrogen and fluorine compensated amorphous layer in a photovoltaic device. The n and n+ type layers in each of the devices are also preferably deposited in amorphous fluorine and hydrogen compensated form. The conventional n dopant materials are readily deposited with the silicon material at the lower temperatures below about 400° C. and result in high doping efficiency. Thus, in D1 and D4, in these structures each of the layers is amorphous silicon and, the p+ layer is best formed with one of the evaporated p-dopant metal vapors at a substrate temperature of at or less than about 400° C. Using gaseous metal or boron compound p-dopant materials requiring high substrate temperatures is also useful, provided the temperature does not reach a value which destroys the characteristics of the underlying amorphous layers.

The second device 26' illustrated in D2 has the opposite configuration from the D1 p-i-n device. In the device 26' a p+ layer 28 is first deposited on the base electrode substrate 18, followed by an intrinsic layer 30 and an outer n+ layer 32. In this device, the p+ layer can be deposited at any substrate temperature in the range of the invention.

The devices 26" and 26''' illustrated in D3 and D4 also are of opposite configuration, being respectively p-n and n-p junction devices. In the device 26", a p+ amorphous silicon layer 34 is deposited on the base electrode substrate 18, followed by a amorphous silicon p layer 36, then an amorphous silicon n layer 38 and finally an amorphous silicon n+ outer layer 40. In the device 26''' the inverse order is followed with an n+ amorphous silicon layer 42 deposited first followed by an n layer 44, a p amorphous silicon layer 46 and finally an outer p+ amorphous silicon layer 48.

A second type of p-i-n junction device 26'''' is illustrated in D5. In this device a first p+ amorphous layer 50 is deposited, followed by an intrinsic amorphous silicon layer 52, an amorphous silicon layer 54 and an outer n+ amorphous silicon layer 56. (The inverse of this structure, not illustrated, also can be utilized).

Following the glow discharge of the various semiconductor layers in the desired order, a fifth step (E) is performed preferably in a separate deposition environment. Desirably, a vapor deposition environment is utilized since it is a faster deposition process than the glow discharge process. In this step, a TCO layer 58 (transparent conductive oxide) is added, for example to device 26, which may be indium tin oxide (ITO), cadmium stannate ($Cd_2SnO_4$), or doped tin oxide ($SnO_2$).

Following the TCO layer 58, an optional step six (F) can be performed to provide an electrode grid 60. The grid 60 can be placed upon the top of the TCO layer 58 depending upon the final size of the devices utilized. In a device 26 having an area of less than 2 square inches or so, the TCO is sufficiently conductive such that an electrode grid is not necessary for good efficiency. If the device has a greater area or if the conductivity of the TCO layer is such that it is desired, the electrode grid 60 can be placed upon the TCO layer to shorten the carrier path and increase the conduction efficiency of the devices.

Figure 2:
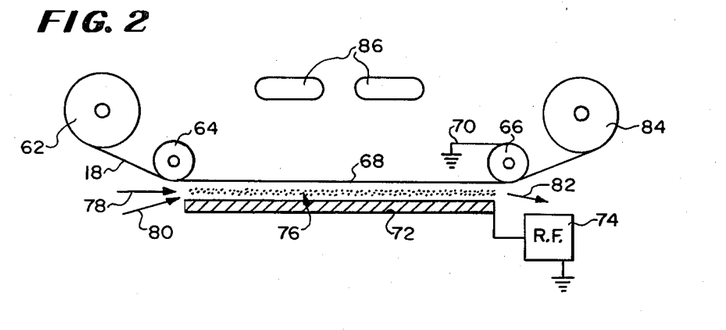
FIG. 2 is a diagrammatic illustration of an apparatus for continuously depositing the semiconductor films of the invention.

As discussed above, the devices 26 to 26'''' can be formed as described in a conventional glow discharge chamber, but preferably are formed in a continuous process as generally illustrated in FIG. 2.

In FIG. 2 a diagrammatic illustration of the continuous processing wherein one deposition area is illustrated. The base electrode substrate 18 is unwound from a payout reel 62 around a pair of rollers 64 and 66 forming a planar deposition area 68 therebetween. The substrate 18 is in electrical contact with the roller 66 which is coupled to ground by a lead 70. The substrate in the planar area 68 forms an anode adjustably spaced from a cathode plate 72. The cathode is coupled to the output terminal of an r.f. source 74. The area between the anode area 68 and the cathode 72 forms a plasma glow discharge deposition region 76.

Although not illustrated, each of the elements in FIG. 2 is enclosed within an evacuated space to isolate the glow discharge region 76 from the surrounding environment. The deposition gases are introduced into the plasma region 76 as illustrated by an arrow 78. The dopant material can be introduced in a second flow stream as illustrated by an arrow 80 or the dopant input can be combined with the deposition gases. The exhausted gases are removed from the plasma region 76 and the system as indicated by an arrow 82.

The deposition area of FIG. 2 can be utilized in a batch mode by introducing the proper mix of gases to form each desired layer in succession. In a continuous process, only one type of material can be deposited in a single pass of the substrate 18 through the plasma area from the payout reel 62 to a takeup reel 84; however, the operation of the reels can be reversed at the end of the web 18 and a second and succeeding layers can be deposited in successive passes through the plasma region 76 with the introduction of the desired dopant material in each pass. The temperature of the substrate 18 can be controlled by one or more infrared heat lamps or other sources 86. The glow discharge deposition may occur at a fairly slow rate of 2 to 5 angstroms of material thickness deposited per second. Assuming the deposition of the semiconductor material 5000 angstroms thick on the substrate 18, the 5000 angstrom layer at 5 angstroms per second would take about 1000 seconds to complete. This is, of course, feasible but it is preferably to deposit the layers on the substrate 18 in a number of deposition stations to increase the deposition rate, as illustrated in FIG. 3.

Figure 3:
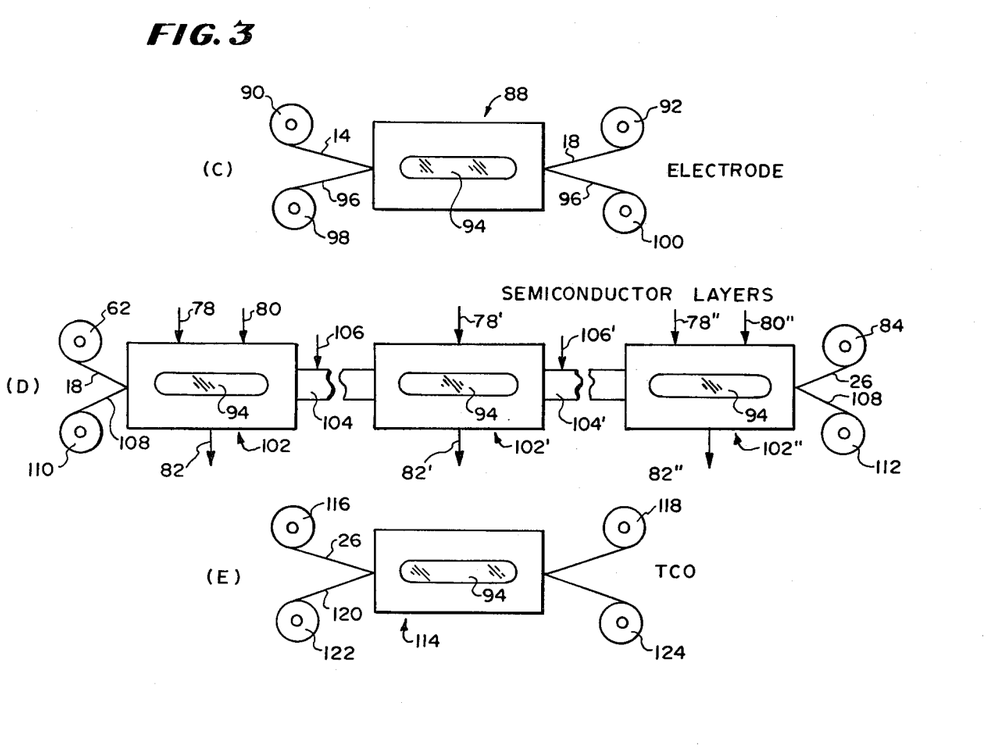
FIG. 3 is a block diagram of one illustrative apparatus for performing the process steps of FIG. 1 to continuously form the improved p-doped semiconductor devices of the invention.

Referring to FIG. 3, an overall system block diagram is illustrated to perform the processes of the steps C, D and E of FIG. 1. Step C can be performed in a vapor deposition chamber 88. The oxidized substrate 14 is fed off a payout reel 90 into and through the chamber 88 where the electrode layer is deposited thereon to form the base electrode substrate 18 and then to a takeup reel 92. The deposition process may be observed through a viewing port 94 visually or by monitoring and control instrumentation.

The electrode layer can be formed with a grid pattern by a mask 96 in the form of a similar web to the substrate 14. The mask 96 is fed off the payout reel 98 into registry with the substrate 14 as it passes through he chamber 88 and then to a takeup reel 100.

Following the deposition of the electrode layer, the base electrode substrate 18 is fed successively into and through a plurality of glow discharge chambers 102, 102' and 102", each including a plasma area like 76 and the other glow discharge elements illustrated in FIG. 2. The same numerals have been utilized in each Fig. to identify identical or substantially identical elements. It also is feasible that all of the chamber deposition areas 76 be enclosed in a single chamber isolated one from another.

The n-i-p device 26 of D1 will be utilized to describe the following specific continuous deposition example. In this case, the base electrode substrate 18 is fed off the payout reel 62 into the chamber 102. The deposition gas, such as premixed silicon tetrafluoride and hydrogen, is fed into the deposition region 76 as indicated by the arrow 78. The dopant material, such as phosphine, is fed into the deposition region 76 as indicated by the arrow 80. The exhausted gases are removed from the chamber as indicated by arrow 82.

Depending on the deposition speed desired and the thickness of the n+ layer 20 to be deposited, there can be one or more chambers 102 each depositing the n+ doped layer 20. Each of the chambers 102 is connected by an isolation passageway 104. The exhaust 82 from each chamber 102 should be sufficient to isolate each of the chambers; however, an inert carrier gas can be bled into each passageway 104 as indicated by an arrow 106 to sweep the passageway 104 clear of any gases from the chamber on either side of the passageway. The doping concentrations can be varied in each of the successive chambers to grade the layers if desired.

The chamber 102' is only fed the premixed deposition gases silicon tetrafluoride and hydrogen shown by the arrow 78' in this example, since it deposits the intrinsic layer 22 without any dopant material being introduced. Again, there can be a plurality of chambers 102' to increase the deposition speed of the layer 22. Further, since each of the chambers 102, 102' etc. is depositing on the same continuous web the number of deposition areas 76 for each layer and the sizes thereof are matched to deposit the desired layer thicknesses for each type of layer for the device to be formed, here n-i-p device 26.

The substrate 18 is then fed into the chamber 102" which is fed the deposition gases as indicated by the arrow 78". The p-dopant material is fed into the deposition area as indicated by the arrow 80". In this example, the p-dopant is the evaporated metal vapor since the p+ layer 24 is being applied over the amorphous n+ and i layers. Again, there can be one or more chambers 102" and the film 26 from the final chamber 102" is taken up on the takeup reel 84.

A mask 108 compatible with the electrode mask 96 can be fed off a payout reel 110 and passed through the successive chambers 102 in registry with the substrate 18. The mask 108 is taken up on a takeup reel 112 following the last chamber 102".

The device film 26 then is fed into a vapor deposition chamber 114 to deposit the TCO layer 58 of step E. The film 26 is fed off a payout reel 116 through the chamber 114 to a takeup reel 118. A suitable mask 120 can be utilized fed from a payout reel 122 to a takeup reel 124. If the electrode grid 60 is desired, it can be applied in a similar vapor deposition chamber with a suitable mask (not illustrated).

For manufacturing a particular device such as the p-i-n device 26', each of the chambers 102, 102' and 102" are dedicated to depositing a particular film layer. As stated above each of the chambers is dedicated to depositing one layer (p, i, or n) since the deposition materials for other layers contaminate the chamber background environment. To optimize each layer of the p-n or p-i-n device, it is critical that dopants from the other types of layers are not present since they will interfere with the preferable electrical characteristics of the layer. For example, depositing a p or n layer first, contamination of the following intrinsic layer by the residual p or n dopant creates localized states in the intrinsic layer. The efficiency of the device thus will be reduced by the contamination. The problem of contamination which causes the lower efficiency of the devices has been encountered when a specific deposition chamber was used for making successive layers of p-n or p-i-n devices. The contamination of the chamber environment is not easily removed so that it presently is not feasible to utilize a single chamber for more than one layer in a continuous process, since other layers are contaminated by the residual materials remaining in the background environment.

While, for purposes of illustration, several forms of this invention have been disclosed, other forms thereof will become apparent to those skilled in the art upon reference to this disclosure and, therefore, this invention is to be limited only by the scope of the appended claims.

We claim:

1. A method of making a p-type silicon semiconductor film, said method comprising the step of depositing on a substrate a semiconductor host matrix film including at least silicon by glow discharge of a compound containing at least silicon in a partial vacuum atmosphere and during glow discharge deposition of the film, introducing an evaporated metal p-dopant modifier element into the silicon depositing glow discharge region which metal modifier element is deposited with the glow discharge deposited silicon film to modify the same to produce a p-type film.

2. The method as defined in claim 1 wherein said evaporated metal modifier element is at least one of the group consisting of aluminum, gallium, indium, zinc or thallium.

3. A method of making a p-type silicon film, said method comprising the step of depositing on a substrate heated to at least above a temperature of 500° C. a semiconductor host matrix film including at least silicon by glow discharge of a compound containing at least silicon in a partial vacuum atmosphere and during glow discharge deposition of the film introducing a p-dopant gaseous compound into the silicon depositing glow discharge region, said p-dopant gaseous compound including at least a p-dopant modifier element and a non-p-dopant-substituent and which gaseous compound disassociates into said p-dopant modifier element and said non-p-dopant substituent at said substrate temperature of at least about 500° C., the p-dopant modifier element then combining with the depositing silicon to modify the silicon semiconductor material to produce a p-type film.

4. The method of claim 3 wherein said p-dopant modifier element is at least one of the group consisting of aluminum, gallium, indium, zinc or thallium.

5. The method of claim 3 wherein said p-dopant modifier element is boron.

6. The method of claim 5 wherein said gaseous compound is diborane.

7. The method as defined in claim 1 wherein said method forms one step in a multi-step process for forming successively by glow discharge deposited silicon-containing films of opposite (p and n) conductivity type, the n-type silicon-containing film being formed by introducing into the glow discharge region a compound containing at least silicon in a partial vacuum atmosphere and during the glow discharge deposition of the film introducing an n-dopant modifier element which is deposited with the glow discharge deposited film to modify the same to produce an n-type film.

8. The method as defined in claim 3 wherein said method forms one step in a multi-step process for forming successively by glow discharge deposited silicon-containing films of opposite (p and n) conductivity type, the n-type silicon-containing film being formed by introducing into the glow discharge region a compound containing at least silicon in a partial vacuum atmosphere and during the glow discharge deposition of the film introducing an n-dopant modifier element which is deposited with the glow discharge deposited film to modify the same to produce an n-type film.

9. The method as defined in claim 1 wherein said method forms one step in a multi-step process for forming successively deposited silicon-containing films of opposite (p and n) conductivity type.

10. The method as defined in claim 3 wherein said method forms one step in a multi-step process for forming successively deposited silicon-containing films of opposite (p and n) conductivity type.

11. The method as defined in claim 8 wherein said n-type silicon-containing film is formed in the presence of at least one density of states reducing element which combines with the depositing silicon-containing film most efficiently at a temperature well below 500° C., said n-type silicon-containing film being applied over said p-type silicon-containing film while the substrate is held at said temperature well below said 500° C.

12. The method as defined in claim 7 wherein said n-type silicon-containing film is formed in the presence of at least one density of states reducing element which combines with the depositing silicon-containing film most efficiently at a temperature well below 500° C., said n-type silicon-containing film being applied over said p-type silicon-containing film while the substrate is held at said temperature well below said 500° C.

13. The method as defined in claim 7 wherein there is deposited between said p and n doped silicon films an intrinsic amorphous silicon-containing film by the glow discharge thereof without a p or n dopant modifying element present therein.

14. The method as defined in claim 9 wherein there is deposited between said p and n doped silicon films an intrinsic amorphous silicon-containing film by the glow discharge thereof without a p or n dopant modifying element present therein.

15. The method as defined in claim 8 wherein there is deposited between said p and n doped silicon films an intrinsic amorphous silicon-containing film by the glow discharge thereof without a p or n dopant modifying element present therein.

16. The method as defined in claim 10 wherein there is deposited between said p and n doped silicon films an intrinsic amorphous silicon-containing film by the glow discharge thereof without a p or n dopant modifying element present therein.

17. The method as defined in claims 1 or 3 wherein there is deposited adjacent to said p-type silicon film an intrinsic amorphous silicon-containing film by the glow discharge thereof without a p or n dopant modifying element present therein.

18. The method as defined in claims 7 or 8 wherein each of said doped silicon-containing film is a substantially amorphous film.

19. The method as defined in claims 7 or 8 wherein said p and n doped silicon-containing films are deposited one immediately on top of the other to form a p-n junction.

20. The method as defined in claims 7 or 8 wherein at least part of said p and n dopant materials are deposited in amounts which form $p^+$ and $n^+$ silicon films.

21. The method as defined in claims 7 or 8 wherein at least one of said silicon-containing films is a substantially amorphous film, and there is included in said silicon compound forming each such film one density of states reducing element and at least one separate density of states reducing element not derived from the compound is introduced into said glow discharge region so that these elements are incorporated in each said substantially amorphous silicon-containing film deposited on said substrate to alter the electronic configurations and produce a reduced density of localized states in the energy gap thereof.

22. The method as defined in claim 7 wherein said substrate is formed in a substantially continuous web, and each of said silicon films is deposited at a separate glow discharge region past which said web is moved to form a substantially continuous deposition process.

23. The method as defined in claim 8 wherein said substrate is formed in a substantially continuous web, and each of said silicon films is deposited at a separate glow discharge region past which said web is moved to form a substantially continuous deposition process.

24. The method as defined in claims 7 or 8 wherein said p-doped containing film is deposited to a thickness of less than 1000 angstroms.

25. The method as defined in claims 7 or 8 including forming each of said semiconducting layers in a continuous process.

26. The method as defined in claims 7 or 8 wherein at least one of said silicon-containing films is a substantially amorphous film and there is included in the glow discharge region forming each such film at least one density of states reducing element so that the element is incorporated in each said substantially amorphous silicon film deposited on said substrate to alter the electronic configurations thereof to produce a reduced density of localized states in the energy gap thereof.

27. The method as defined in claims 1 or 3 wherein said compound includes hydrogen.

28. The method as defined in claims 1 or 3 wherein said compound includes fluorine.

29. The method as defined in claims 1 or 3 wherein said compound includes fluorine and hydrogen.

30. The method as defined in claims 1 or 3 wherein said compound is at least a mixture of $SiF_4$ and $H_2$.

31. A method of making a photovoltaic panel comprising forming a roll of a web of a flexible substrate material with one or more electrode-forming regions thereon, unrolling said substrate roll substantially continuously into a partially evacuated space including at least one silicon depositing region therein where there is deposited over at least some of said one or more electrode-forming regions at least two thin, flexible silicon films which are of opposite conductivity (p and n) type, one or more of said films forming a photovoltaic depletion region, said substrate is formed in a substantially continuous web, and each of said silicon films is deposited at a separate glow discharge region past which said web is moved to form a substantially continuous deposition process, and subsequently applying on said silicon films a thin flexible electrode-forming layer, separately as to each of said electrode-forming regions.

32. The method as defined in claim 31 wherein depositing said p-type film includes depositing a semiconductor host matrix film including at least silicon by glow discharge of a compound containing at least silicon in said partial vacuum atmosphere and during the glow discharge deposition of the film introducing an evaporated metal p-dopant modifier element into the silicon depositing glow discharge station which metal modifier element is deposited with the glow discharge deposited silicon film to modify same to form the p-type film.

33. The method as defined in claim 32 wherein said evaporated metal modifier element is at least one of the group consisting of aluminum, gallium, indium, zinc or thallium.

34. The method as defined in claim 31 wherein depositing said p-type film includes depositing on said substrate heated to at least above a temperature of 500° C. and below 800° C. a semiconductor host matrix film including at least silicon by glow discharge of a compound containing at least silicon in said partial vacuum atmosphere and during the glow discharge deposition of the film introducing a p-dopant gaseous compound into the silicon depositing glow discharge region, said p-dopant gaseous compound including at least a p-dopant modifier element and a non-p-dopant substituent and which gaseous compound disassociates into said p-dopant modifier element and said non-p-dopant substituent at said substrate temperature of at least above 500° C., the p-dopant modifier element then combining with the depositing silicon to modify the silicon semiconductor material to form the p-type film.

35. The method as defined in claim 34 wherein said p-dopant modifier element is at least one of the group consisting of aluminum, gallium, indium, zinc or thallium.

36. The method as defined in claim 34 wherein said p-dopant modifier element is boron.

37. The method as defined in claim 36 wherein said gaseous compound is diborane.

38. The method as defined in claim 31 wherein there is deposited between said p and n doped silicon films an intrinsic amorphous silicon-containing film by the glow discharge thereof without a p or n dopant modifying element present therein.

39. The method as defined in claim 31 wherein at least one of said silicon-containing films is a substantially amorphous film, and there is included in said silicon compound forming each such film one density of states reducing element and at least one separate density of states reducing element not derived from the compound is introduced into said glow discharge region so that these elements are incorporated in each said substantially amorphous silicon-containing film deposited on said substrate to alter the electronic configurations and produce a reduced density of localized states in the energy gap thereof.

40. The method as defined in claim 31 wherein said p-doped silicon-containing film is deposited to a thickness of less than 1000 angstroms.

41. The method as defined in claim 31 wherein said compound includes fluorine.

42. The method as defined in claim 31 wherein said compound is at least a mixture of $SiF_4$ and $H_2$.

43. The method as defined in claim 31 wherein said compound is at least a mixture of $SiF_4$ and $H_2$ in the ratio of 4 to 1 to 10 to 1.

* * * * *

UNITED STATES PATENT AND TRADEMARK OFFICE
CERTIFICATE OF CORRECTION

PATENT NO. : 4,400,409       Page 1 of 3

DATED      : August 23, 1983

INVENTOR(S): Masatsugu Izu, et al.

It is certified that error appears in the above-identified patent and that said Letters Patent is hereby corrected as shown below:

Cover page, under References Cited, delete "4,217,374 8/1980 Orshinsky" and insert --4,217,374 8/1980 Ovshinsky--;

Cover page, under References Cited, delete "4,226,898 10/1980 Orshinsky" and insert --4,226,898 10/1980 Ovshinsky--;

Column 1, line 29, after "either" insert --of--;

Column 1, line 59, delete "optional" and insert --optical--;

Column 3, lines 25 and 26, after "hydrogen," delete "to determine the results of such molecular hydrogen";

Column 3, lines 57 and 58, delete "copending U.S. Applications Serial Nos. 884,664 and 887,353" and insert --U.S. Patents Nos. 4,217,374 and 4,226,898, issued 8/12/80 and 10/7/80, respectively to Ovshinsky et al.--;

Column 3, line 61, delete "application" and insert --patent--;

Column 3, lines 63 and 64, delete "appli-cation" and insert --patent--;

Column 4, line 11, delete "alterant" and insert --altering--;

Column 4, lines 17 and 18, delete "application Serial No. 887,353" and insert --U.S. Patent No. 4,226,898--;

UNITED STATES PATENT AND TRADEMARK OFFICE
CERTIFICATE OF CORRECTION

PATENT NO. : 4,400,409

DATED : August 23, 1983

INVENTOR(S) : Masatsugu Izu, et al.

It is certified that error appears in the above-identified patent and that said Letters Patent is hereby corrected as shown below:

```
Column  4, line 29, delete "alterant" and insert
--altering--;
Column  4, line 54, delete "application" and insert
--patent--;
Column  6, line 38, delete "p-doping" and insert
--p-dopant--;
Column  6, line 56, after "alloying" insert --,--;
Column  8, line 60, after "instance" delete --,--;
Column  8, line 60, after "thick" insert --,--;
Column  9, line  4, delete "4" and insert --14--;
Column  9, line 20, delete "application Serial No. 887,353"
and insert --U.S. Patent No. 4,226,898--;
Column  9, line 52, delete "photoconductive" and insert
--photoconductivity--;
Column  9, line 62, after "between" insert --about--;
Column 10, line  3, delete "application Serial No. 887,353"
and insert --Patent No. 4,226,898--
```
Column 10, line 48, delete "$n^{30}$" and insert --$n^+$--;
```
Column 11, line  1, delete "application Serial No. 887,353"
and insert --Patent No. 4,226,898--;
Column 12, line 57, delete "preferably" and insert
--preferable--;
```

UNITED STATES PATENT AND TRADEMARK OFFICE
CERTIFICATE OF CORRECTION

PATENT NO. : 4,400,409

DATED : August 23, 1983

INVENTOR(S) : Masatsugu Izu, et al.

Page 3 of 3

It is certified that error appears in the above-identified patent and that said Letters Patent is hereby corrected as shown below:

```
Column 13, line  6, delete "he" and insert --the--;
Column 14, line  1, delete "utilized";
Column 14, line 54, after "500°C" insert --and below
800°C--;
Column 14, line 65, delete "about" and insert --above--;
Column 15, line 55, delete "films" and insert --film--;
Column 15, line 60, delete "films" and insert --film--;
Column 15, line 65, delete "films" and insert --film--;
Column 16, line  2, delete "films" and insert --film--;
Column 16, line 12, delete "film" and insert --films--.
```

Signed and Sealed this

Eighteenth Day of June 1985

[SEAL]

*Attest:*

DONALD J. QUIGG

*Attesting Officer*     *Acting Commissioner of Patents and Trademarks*